United States Patent [19]

Asai et al.

[11] Patent Number: 4,732,731
[45] Date of Patent: Mar. 22, 1988

[54] COPPER ALLOY FOR ELECTRONIC INSTRUMENTS AND METHOD OF MANUFACTURING THE SAME

[75] Inventors: Makoto Asai, Nikko; Shoji Shiga, Utsunomiya; Toru Tanigawa, Nikko; Yoshimasa Ōyama, Nikko; Shigeo Shinozaki, Nikko, all of Japan

[73] Assignee: The Furukawa Electric Co., Ltd., Tokyo, Japan

[21] Appl. No.: 900,429

[22] Filed: Aug. 26, 1986

[30] Foreign Application Priority Data

Aug. 29, 1985 [JP] Japan ................................ 60-190605

[51] Int. Cl.$^4$ ............................................... C22C 9/06
[52] U.S. Cl. .................... 420/473; 420/485; 148/433; 148/435
[58] Field of Search ............. 420/473, 485, 492; 148/414, 412, 433, 435

[56] References Cited

U.S. PATENT DOCUMENTS 4,601,879 7/1986 Dürrschnabel et al. ............ 420/473
4,612,167 9/1986 Watanabe et al. .................. 420/481

FOREIGN PATENT DOCUMENTS 3421198 6/1985 Fed. Rep. of Germany ...... 420/473
116737 6/1985 Japan ................................. 420/481

Primary Examiner—L. Dewayne Rutledge
Assistant Examiner—George Wyszomierski
Attorney, Agent, or Firm—Oblon, Fisher, Spivak, McClelland & Maier

[57] ABSTRACT

A copper alloy is disclosed, which contains 0.1 to 3.0 wt % of Ni, 0.1 to 1.0 wt % of Ti, the ratio of Ni to Ti being $4 \leq$ Ni/Ti thereby, 0.1 to 6.0 wt % of Sn, and 0.005 to 3.0 wt % in total of one or more elements selected from the group consisting of Zn, Mn, Mg, Ca, RE, B, Sb, Te, Si, Co, Fe, Zr, Ag, Mm and Al, and consists of the remainder of Cu and the inevitable impurities. The method for the manufacture of the alloy is characterized in that, after copper alloy ingot was maintained and homogenized for 0.5 to 15 hours at 750° to 960° C. prior to rolling, the hot rolling is carried out starting from a temperature of 700° to 880° C. and the cooling is made immediately after the end of rolling.

7 Claims, No Drawings

COPPER ALLOY FOR ELECTRONIC INSTRUMENTS AND METHOD OF MANUFACTURING THE SAME

BACKGROUND OF THE INVENTION

The present invention relates to a copper alloy, having high strength, the electrical conductivity and the heat resistance are excellent, the machinability and the adhesion of plating are good, and further the deterioration of interfacial strength with the solder is not observed with the lapse of time, and a method of manufacturing the same. The alloy is suitable for use in the lead frame of semiconductor instruments, in particular.

In general, a lead frame used for semiconductor instruments must have the following characteristics.

(1) High mechanical strength and good heat resistance (2) High thermal dissipation, that is, high thermal conductivity and electrical conductivity (3) Good bending formability after formed into frame (4) Good adhesion of plating and good moldability with resin (5) Good solderbility, in particular, no time-dependent deterioration at bound portion with solder In following, a description will be made in detail about the lead frame for which the alloy of the invention is used.

Conventionally, for the lead frame used for electronic instruments, 42 alloy (Fe-42 wt % Ni) has been used principally. This alloy exhibits excellent characteristics as shown by a tensile strength of 63 kg/mm$^2$ and a heat resistance (a temperature at which the strength becomes to 70% of initial strength by heating for 30 minutes) of 670° C., but the electrical conductivity thereof is inferior being as low as about 3% IACS.

Recently, for semiconductor elements, high reliability has been required together with an increase in the integration degree and the miniaturization, and the shape of semiconductor elements are also changing from conventional DIP type IC to chip carrier type and PGA type. For this reason, the lead frame used for semiconductor elements is also made thin and miniaturized and, at the same time, properties superior to those of 42 alloy have been required. Namely, it is necessary to improve strength to prevent the lowering of strength constituent parts due to the thinning, and to improve the electrical conductivity, being the same characteristic as the thermal conductance. It is also necessary to enhance the thermal radiation due to an increase in the integration degree, further, improve heat resistance, improve the plating operativity and adhesion of plating to the surface of the lead frame for the pretreatment of fixing the semiconductor onto the frame and bonding from semiconductor to wiring at the foot portion of the lead frame. It is also necessary to improve the moldability with sealing resin, and additionally no time-dependent deterioration of binding strength with solder in the connection of the frame to substrate must be observed.

SUMMARY OF THE INVENTION

As a result of extensive investigations in view of the situation, the present invention provides a copper alloy for electronic instruments having a strength equal to or higher than that of 42 alloy and having excellent electrical conductivity compared with it. Also, a method of manufacturing the same is herein provided.

Namely, the invention is characterized in that, (1) The copper alloy for electronic instruments contains 0.1 to 3.0 wt % of Ni, 0.1 to 1.0 wt % of Ti, the ratio of Ni to Ti being $4 \leq$ Ni/Ti thereby, 0.1 to 6.0 wt % of Sn, and 0.005 to 3.0 wt % in total of one or more elements selected from a group consisting of Zn, Mn, Mg, MM (misch metal), B, Sb, Te, Si, Co, Zr rare earth elements, Ca, Fe, Ag and Al, and consists of the remainder of Cu and the inevitable impurities.

(2) In said copper alloy described in item 1, the content of $O_2$ is made not more than 20 ppm and further the particle diameter of precipitates is made not more than 5 μm.

(3) The copper alloy aforementioned is manufactured by a method wherein said copper alloy is submitted to melt-casting in a nonoxidative atmosphere to obtain the ingot of said copper alloy by semicontinuous or continuous casting method and, after keeping and homogenizing the ingot for 0.5 to 15 hours at 750° to 960° C. prior to rolling, the hot rolling is carried out starting from a temperature of 700° to 880° C. and the cooling is made immediately after the end of rolling.

DETAILED DESCRIPTION OF THE INVENTION

In the invention, if the contents of Ni and Ti are less than those described above, the improvement in the characteristics due to the synergic effect cannot be seen and, if Ni and Ti are added in excess of the respective ranges described above, the bending moldability, the castability and the machinability decrease remarkably making manufacturing difficult. Moreover, the reason why the Ni/Ti ratio is confined in that higher strength is required for obtaining more excellent electrical conductivity than that of the 42 alloy and for miniaturization and the thinning. If the ratio of Ni/Ti is smaller than 4, the electrical conductivity is excellent, but the strength is insufficient. A Ni/Ti ratio of about 4 to 10 is preferred.

As to the content of Sn, both the strength and the bending moldability are improved using the range described above, but, outside of this range, the effects are not observed and the machinability decreases to make many difficulties. Furthermore, for the addition of Sn, (i) The effect that the dispersion in the characteristics due to the difference of the conditions of hot rolling (start temperature, end temperature, cooling velocity, etc.) can be suppressed has been observed in various experiments, and, if the amount of Sn is less than the above range, the effect is poor, if greater, the manufacturing property becomes worse.

Zn, Mn, Mg, RE (Rare Earth Elements), B, Sb, Te, Si, Co, Zr, Al, Fe, Ag and, Ca and MM act as deoxidizing agents and improve the hot workability. In particular, they improve castability and prevent cracking due to reheating at the time of the soaking treatment prior to hot rolling and prevent the cracking due to hot rolling at the time of the rolling, which are also exhibited by Cr, and P, etc. In addition to these effects, improvement in electroplatability such as the adhesion of plating resin moldability adhesiveness of oxide scale and solderbility and further improvement in the characteristics due to the synergic effect are intended. If under the range, electric and thermal conductivity effects are not exerted and, if over the range, the adhesion of plating, castability and bending moldability are made worse. Furthermore, through such addition, there is also an effect for solderability, in particular, the suppression of time-dependent deterioration of the joint strength with solder resulting from the strengthening of interface with solder, and, if under the specified range, this effect becomes poor.

Next, the content of $O_2$ is preferred to be not more than 20 ppm (preferably, not more than 10 ppm) in the melt at the time of casting, because, if over this value, Ti forms an oxide slag from the melt, making castability worse and control of Ti content difficult. Moreover, in the final product, adhesion of plating and solderability become poor.

The size of the deposits can effect significantly on formability, electroplatability and the wettability of solder and, if over 5 μm, both properties are lowered markedly.

The present invention consists of the said ingredients with the remainder of Cu.

As additional ingredient, it is possible to include 0.001 to 1.0 wt % of one or more of Cr, Cd, Be, Y, In, Tl, Pb, V, Nb, Ta, As, Se, etc.

Those addtional elements affect the improvement of grain refining and workability.

With regard to the manufacturing method, Ti used for the alloy of the invention is active, and is apt to be oxidized resulting in the formation of the oxide in the atmosphere, and it would appear beneficial for exclude Ti due to the occurrence of slag. However, by carrying out the melting and casting in nonoxidative atmospheres such as Ar, $N_2$, etc., it becomes possible to cover the foregoing defects and great improvement can be obtained in producibility. Moreover, the cooling velocity is preferred to be not less than 100° C./sec in the semicontinuous or continuous casting process. If less than this velocity, deposits consisting of the constituent elements occur and they become coarser at the time of the homogenization treatment prior to hot rolling advantageously affecting the desired proerties and the manufacturing property thereafter.

Furthermore, the conditions of the homogenization treatment prior to hot rolling are particularly preferred to be 800° to 880° C. and 2 to 8 hours. If less than these ranges, the effect of homogenization is not observed and, if greater than these ranges, the cracking due to preheating and the cost of production are made worse. The starting temperature of the hot rolling is preferred to be 750° to 850° C. and, if out of this range, the cracking due to the hot rolling is apt to occur. The cooling after hot rolling may be made at any cooling velocity because of the supressing effect on the dispersion of characteristics due to the addition of Sn, but the velocity is preferable to be not less than 500° C./min., in particular.

Due to the present invention, it is now possible to obtain more excellent characteristics by repeating cold processing after hot processing and annealing for 10 seconds to 360 minutes at 400° to 800° C. and finally by combining with the refining annealing at 20° to 500° C., tension leveling and the like.

In the following the invention will be illustrated in detail based on the examples, which are not intended to be limiting.

EXAMPLE

Employing an atmospheric melt furnace, copper alloys, the compositions of which are shown in Table 1, were melted and casted in Ar to obtain the ingots with a size of 50 mm×120 mm×200 mm. After scralping the faces and submitted to the soaking treatment for 3 hours at 850° C., the hot rolling at 830° C. and the cooling with water were carried out to make the plates with a thickness of 10 mm. Then, the cold rolling and the intermediate annealing (570° C., 1 hour; in case of Comparative alloy No. 21 in Table 1, 700° C., 1 hour) were repeated to finish the plates with a thickness of 0.25 mm at a final processing rate of 40%. These plates were submitted to the low temperature treatment at 250° C. to make the test materials, of which tensile strength, bending moldability (R/t), Adhesion of plating and moldability (strippability of oxidized film) were examined. Results are put down in Table 1.

The tensile strength and the electrical conductivity were measured according to JIS-Z2241 and JIS-H0505, respectively, and the bending moldability was tested based on the V block method designated in JIS-Z2248, which is shown as a value of minimum bending radius to cause the cracking on the surface of test piece devided by the thickness of test piece.

The adhesion of plating was determined in such a way that a sample with 30×30 mm was cut off from the test material and, after cleaning the surface, Ag plating was conducted, then, this was heated in the atmosphere and subsequent blistering on the surface of plating was observed. One the blistering being not seen by heating for 5 minutes at 550° C. was marked as "O" and one the blistering being seen was marked as "X".

Moreover, the adhesiveness of the oxidized film was determined in such a way that a sample with 10×50 mm was cut off from the test material and, after the cleaning treatment of the surface, the sample was heated for 1 minute at 420° C. in the atmosphere to form the oxidized film on the surface, then the stripping test was conducted using adhesive cellotape. Samples where stripping was hardly seen were marked as "O" and samples where stripping was seen on the whole surface were marked as "X".

As to the joint strength with solder, a sample with 5×50 mm was cut off from the test material, this was found to an oxygen-free copper sample in the shape with 60/40 eutectic solder and, after the acceleration test for 500 hours at 150° C., the tensile test was conducted. In the case of the strength being more than 80% of that before the acceleration test, "O" was marked, in the case of being more than 50%, "Δ" was marked and, in the case of being less than 50%, "X" was given.

TABLE 1

| | Compostion of ingredient | | | | $O_2$ | Particle* diameter of deposits | Ni/ Ti | Strength kg/mm$^2$ | Conductivity % IACS | R/t | Binding strength with solder | Adhesion of plating | Strippability of oxidized film |
|---|---|---|---|---|---|---|---|---|---|---|---|---|---|
| | Ni | Ti | Sn | X | | | | | | | | | |
| | | | | Alloy of the invention | | | | | | | | | |
| 1 | 1.0 | 0.20 | 0.7 | Mn 0.03 | 5 | 0.4 | 5.0 | 58 | 54 | 0.8 | O | O | O |
| 2 | 1.5 | 0.25 | 1.9 | Mg 0.02  Zn 0.5 | 8 | 0.2 | 8.0 | 66 | 37 | 1.2 | O | O | O |
| 3 | 1.8 | 0.35 | 2.4 | MM 0.012 | 4 | 0.3 | 5.1 | 66 | 48 | 1.2 | O | O | O |
| 4 | 2.8 | 0.52 | 3.7 | Zn 0.72  B 0.02 | 11 | 0.7 | 5.4 | 68 | 42 | 1.6 | O | O | O |

TABLE 1-continued

| | Composition of ingredient | | | | | | Particle* diameter of deposits | Ni/ Ti | Strength kg/mm² | Conductivity % IACS | R/t | Binding strength with solder | Adhesion of plating | Strippability of oxidized film |
|---|---|---|---|---|---|---|---|---|---|---|---|---|---|---|
| | Ni | Ti | Sn | X | | | O₂ | | | | | | | |
| 5 | 1.7 | 0.24 | 1.8 | Si 0.04 | | | 6 | 1.1 | 7.1 | 67 | 39 | 1.2 | O | O | O |
| 6 | 1.7 | 0.23 | 1.9 | Te 0.02 | Zn 0.5 | | 4 | 2.0 | 7.4 | 68 | 36 | 1.2 | O | O | O |
| 7 | 1.7 | 0.23 | 1.8 | Mn 0.02 | Mg 0.014 | Zn 0.4 | 4 | 0.5 | 7.4 | 68 | 36 | 1.2 | O | O | O |
| 8 | 1.7 | 0.24 | 1.8 | Mn 0.03 | B 0.02 | | 5 | 1.0 | 7.1 | 67 | 39 | 1.2 | O | O | O |
| 8 | 1.7 | 0.23 | 1.8 | Al 0.01 | Si 0.02 | | 5 | 2.0 | 7.4 | 68 | 37 | 1.2 | O | O | O |
| 9 | 1.7 | 0.23 | 1.8 | Zn 0.4 | Mg 0.02 | MM** 0.02 | 6 | 3.1 | 7.4 | 68 | 39 | 1.2 | O | O | O |
| 10 | 1.7 | 0.23 | 1.8 | Mn 0.05 | Si 0.04 | | 5 | 0.5 | 7.4 | 69 | 35 | 1.2 | O | O | O |
| 11 | 1.7 | 0.22 | 1.8 | B 0.008 | Zr 0.02 | Al 0.02 | 3 | 0.3 | 7.7 | 70 | 36 | 1.2 | O | O | O |
| 12 | 1.7 | 0.23 | 1.8 | Co 0.1 Si 0.03 | Mn 0.03 Zn 0.3 | Te 0.02 | 4 | 0.1 | 7.4 | 70 | 34 | 1.2 | O | O | O |
| | | | | Comparative alloy | | | | | | | | | | | |
| 13 | 0.9 | 0.02 | 2.1 | Mn 0.02 | | | 10 | 0.2 | 45 | 58 | 31 | 1.2 | X | O | O |
| 14 | 1.2 | 1.40 | 2.5 | MM 0.03 | Zn 0.3 | | 7 | 0.4 | 0.9 | — | — | — | — | — | — |
| 15 | 3.9 | 0.30 | 1.4 | Ca 0.01 | | | 8 | 0.5 | 13 | 65 | 24 | 3.6 | X | X | X |
| 16 | 0.03 | 0.31 | 1.2 | Zn 0.4 | Mg 0.02 | | 6 | 0.4 | 0.1 | 52 | 27 | 1.6 | O | O | O |
| 17 | 1.6 | 0.26 | 7.5 | Te 0.03 | Zn 0.3 | | 12 | 1.2 | 6.2 | — | — | — | — | — | — |
| 18 | 1.7 | 0.23 | 1.8 | Mn 1.8 | Si 1.6 | Al 0.4 | 6 | 3.2 | 7.4 | 85 | 7 | 2.8 | Δ | X | X |
| 19 | 1.7 | 0.23 | 1.8 | Al 2.8 | Co 0.5 | | 5 | 2.4 | 7.4 | 83 | 8 | 2.8 | Δ | X | X |
| 20 | 1.7 | 0.23 | 1.8 | Mn 0.04 | B 0.01 | | 44 | 1.1 | 7.4 | 67 | 38 | 1.6 | Δ | X | O |
| 21 | 1.7 | 0.23 | 1.8 | Mn 0.02 | Zn 0.1 | | 7 | 11.0 | 7.4 | 65 | 32 | 2.4 | Δ | X | O |
| 22 | | | | 42 Alloy (Conventional alloy) | | | | | | 63 | 3 | 1.2 | O | O | O |

*μm
**MM: Mish metals

As evident from Table 1, it can be seen that the alloys of the invention have excellent strength and electrical conductivity compared with No. 22 "42 Alloy" which is a conventional alloy.

Whereas, with comparative alloys No. 13 and 16 having less Ti or Ni, the improvement in the strength cannot be recognized. Moreover, in the cases of comparative alloys No. 14 and 15 having too much more Ti or Ni, the hot rolling was difficult with the former and the inferiority in both adhesion of plating and moldability can be seen with the latter.

Comparative alloy No. 17 having more Sn showed the difficulty in the hot rolling similarly to No. 14. Furthermore, in the cases of Comparative alloys No. 18 and 19 having more amounts of X elements, not only the adhesion of plating and bending formability are inferior but also the lowering in the electrical conductance is serious, and, in the case of Comparative alloy No. 20 having more O₂, the adhesion of plating is poor. Moreover, with Comparative alloy No. 21 having large particle diameter of deposits, the joint strength with solder and the adhesion of plating are inferior.

As described, the alloys manufactured in accordance with the invention are excellent in the electrical conductance, tensile strength, bending moldability, solderability, etc., and, when using for the materials for semiconductor instruments such as lead frame etc., the thinning and the miniaturization thereof are made possible. The present alloys are useful also in the production of connectors, contact springs, terminals and various conductors, etc. Based on these facts and others, the invention exerts remarkable effects industrially.

What is claimed is:

1. A copper alloy for electronic instruments which consists essentially of 0.1 to 3.0 wt.% of Ni, 0.1 to 1.0 wt.% of Ti, wherein the ratio of Ni/Ti is greater than or equal to 4, 0.1 to 6.0 wt.% of Sn, and 0.005 to 3.0 wt.% in total of one or more elements selected from the group consisting of Zn, Mn, Mg, the rare earth elements, Ca, B, Sb, Te, Si, Co, Fe, Zr, Ag, MM (misch metal) and Al with the remainder being Cu and inevitable impurities, and wherein said alloy contains O₂ in an amount of not more than 20 ppm, and wherein said alloy has a particle diameter of precipitates of not more than 5 μm.

2. The copper alloy according to claim 1, which further contains 0.001 to 1.0 wt.% in total of one or more elements selected from the group consisting of Cr, Cd, Be Y, In, Tl, Pb, V, Nb, Ta, As, and Se.

3. The copper alloy according to claim 1, wherein said alloy contains oxygen in an amount of not more than 10 ppm.

4. The copper alloy according to claim 1, wherein said alloy contains 1.0 to 2.8 wt.% of Ni, 0.20 to 0.52 wt% of Ti and 0.7 to 3.7 wt.% of Sn.

5. The copper alloy according to claim 1, having a tensile strength of at least 66 kg/mm².

6. The copper alloy according to claim 1, wherein the ratio of Ni/Ti is in the range of 4–10.

7. The copper alloy according to claim 1, produced by a method comprising:
   (a) subjecting said copper alloy to melt-casting in a non-oxidative atmosphere, to obtain an ingot of said copper alloy by semi-continuous or continuous casting,
   (b) maintaining the ingot for 0.5 to 15 hours at 750° to 960° C., thereby homogenizing the same,
   (c) hot rolling said ingot at a temperature of 700° to 880° C., and
   (d) cooling said ingot after the end of said rolling.

* * * * *